United States Patent
Cooper

(10) Patent No.: US 6,674,374 B1
(45) Date of Patent: Jan. 6, 2004

(54) DATA COMPRESSOR UTILIZING SWITCHED INPUT COINCIDENCE ELEMENTS

(75) Inventor: Albert B. Cooper, New York, NY (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/351,210

(22) Filed: Jan. 25, 2003

(51) Int. Cl.[7] .............................................. H03M 7/34
(52) U.S. Cl. .......................................... 341/51; 341/67
(58) Field of Search ............................. 341/51, 50, 67, 341/63, 65; 708/203

(56) References Cited

U.S. PATENT DOCUMENTS 5,951,623 A * 9/1999 Reynar et al. ............... 708/203
6,307,488 B1 * 10/2001 Cooper ......................... 341/51
6,608,570 B1 * 8/2003 Cooper ......................... 341/51

* cited by examiner

Primary Examiner—Jean Jeanglaude
(74) Attorney, Agent, or Firm—Albert B. Cooper; Nathan Cass; Mark T. Starr

(57) ABSTRACT

A data compressor for compressing an input stream of data characters into an output stream of compressed codes includes a plurality of AND-gates corresponding to a respective plurality of codes to be assigned to strings. Each string comprises a prefix string, having an associated prefix code, and an extension character. An AND-gate has a prefix code input and a character input for enabling the AND-gate, the energized output of an AND-gate providing a representation of the code corresponding thereto. The compressor includes a first matrix switch for selectively coupling the provided representations of codes corresponding to the AND-gates to the prefix code inputs of the AND-gates and a second matrix switch for selectively coupling representations of data characters fetched from the input stream to the character inputs of the AND-gates. Data characters are sequentially fetched from the input stream so as to sequentially enable AND-gates until a last data character is fetched that does not result in an enabled AND-gate. The code is output that corresponds to the last enabled AND-gate, thereby providing the stream of compressed codes.

18 Claims, 7 Drawing Sheets

INPUT DATA CHARACTER STREAM

$a_1\ b_1\ a_2\ b_2\ a_3\ b_3\ a_4\ b_4\ c_1\ a_5\ b_5\ c_2\ a_6\ b_6\ c_3\ a_7\ b_7\ c_4\ d_1$

| ACTION | CURR MATCH | CURR CHAR | ENABLED AND-GATE | OUTPUT | ASSIGNED AND-GATE | BLOCK OF FIG. 4 |
|---|---|---|---|---|---|---|
| 1 | $a_1$ | $b_1$ | NONE | a1 | 258 | 80-86,100-105 |
| 2 | $b_1$ | $a_2$ | none | $b_1$ | 259 | 106,85,86,100-105 |
| 3 | $a_2$ | $b_2$ | 258 | | | 106,85,86 |
| 4 | 258 | $a_3$ | none | 258 | 260 | 87,88,85,86,100-105 |
| 5 | $a_3$ | $b_3$ | 258 | | | 106,85,86 |
| 6 | 258 | $a_4$ | 260 | | | 87,88,85,86 |
| 7 | 260 | $b_4$ | NONE | 260 | 261 | 87,88,85,86,100-105 |
| 8 | $b_4$ | $c_1$ | NONE | $b_4$ | 262 | 106,85,86,100-105 |
| 9 | $c_1$ | $a_5$ | NONE | $c_1$ | 263 | 106,85,86,100-105 |
| 10 | $a_5$ | $b_5$ | 258 | | | 106,85,86 |
| 11 | 258 | $c_2$ | NONE | 258 | 264 | 87,88,85,86,100-105 |
| 12 | $c_2$ | $a_6$ | 263 | | | 106,85,86 |
| 13 | 263 | $b_6$ | NONE | 263 | 265 | 87,88,85,86,100-105 |
| 14 | $b_6$ | $c_3$ | 262 | | | 106,85,86 |
| 15 | 262 | $a_7$ | NONE | 262 | 266 | 87,88,85,86,100-105 |
| 16 | $a_7$ | $b_7$ | 258 | | | 106,85,86 |
| 17 | 258 | $c_4$ | 264 | | | 87,88,85,86 |
| 18 | 264 | $d_1$ | NONE | 264 | 267 | 87,88,85,86,100-105 |
| 19 | $d_1$ | • • | | $d_1$ | | 106,85,100,END |

*Figure 5*

DATA COMPRESSOR UTILIZING SWITCHED INPUT COINCIDENCE ELEMENTS

CROSS REFERENCE TO RELATED APPLICATIONS

U.S. patent application Ser. No. 10/195,795 "Matrix Implemented Data Compression Apparatus and Method" by Cooper, filed Jul. 15, 2002, discloses a matrix implementation for LZ type compressors.

U.S. patent application Ser. No. 10/271,196 "Data Compression Apparatus and Method Utilizing Tandem Coupled Matrices" by Cooper, filed Oct. 15, 2002, discloses a tandem coupled matrix implementation for LZ type compressors.

Said Ser. No. 10/195,795 and Ser. No. 10/271,196 are incorporated herein by reference.

BACKGROUND OF THE INVENTION

1. Field of the Invention

The invention relates to data compression systems based on the LZ data compression methodology and more particularly on the LZW protocols.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, Jul. 31, 1990. TIFF is a development of Aldus Corporation and the name TIFF is a Trademark thereof. Reference to the TIFF specification is found in TIFF, Revision 6.0, Final—Jun. 3, 1992.

LZW has also been adopted as the standard for V.42 bis modem compression and decompression. A reference to the V.42 bis standard is found in CCITT Recommendation V.42 bis, Data Compression Procedures For Data Circuit Terminating Equipment (DCE) Using Error Correction Procedures, Geneva 1990. The V.42 bis standard is further described in an article entitled "V.42 bis: The New Modem Compression Standard" by J. E. MacCrisken in the Spring 1991 issue of the Journal Of Data & Computer Communications—Modem Compression, pages 23–29.

Examples of LZ dictionary based compression and decompression systems are described in the following U.S. patents: U.S. Pat. No. 4,464,650 by Eastman et al., issued Aug. 7, 1984; U.S. Pat. No. 4,814,746 by Miller et al., issued Mar. 21, 1989 U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; U.S. Pat. No. 5,861,827 by Welch et al., issued Jan. 19, 1999; and U.S. Pat. No. 6,320,523 by York et al., issued Nov. 20, 2001.

In the above dictionary based LZ compression and decompression systems, the compressor and decompressor dictionaries may be initialized with all of the single character strings of the character alphabet. In some implementations, the single character strings are considered as recognized and matched although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment the alphabet has an 8 bit character size supporting an alphabet of 256 characters. Thus, the characters have values of 0–255. The first available multiple character string code can, for example, be 258 where the codes 256 and 257 are utilized as control codes as is well known.

In the prior art dictionary based LZ compression systems, data character strings are stored and accessed in the compressor dictionary utilizing well known searchtree architectures and protocols. Typically, the searchtree is arranged in nodes where each node represents a character, and a string of characters is represented by a node-to-node path through the tree. When the input character stream has been matched in the dictionary tree up to a matched node, a next input character is fetched to determine if the string match will continue. Conventionally, a determination is made to ascertain if the fetched character is already stored as an extension node of the matched node. Various techniques are utilized to effect this determination such as associative memory dictionaries, hashing and sibling lists as are well understood in the art.

In the above dictionary based systems, numerous dictionary accesses are required at the compressor for compressing an input stream of data characters. Normally several dictionary accesses are required for each input data character and when utilizing an associative memory, it may be necessary to search the entire memory to determine if a string exists therein. It is desirable in such systems to minimize the number of dictionary accesses so as to enhance system performance.

Although the known dictionary architecture and protocols provide efficient data compression systems, it is a continuing objective in the art to improve compressor performance.

The data compressor of said Ser. No. 10/195,795 provides an improvement over the prior art by replacing the known dictionary architecture by a matrix of coincidence elements. The embodiments of said Ser. No. 10/195,795 utilize a significant number of coincidence elements.

SUMMARY OF THE INVENTION

The present invention replaces the conventional dictionary arrangements with digital logic elements and switches to provide a new architecture and protocols which, it is believed, will improve the performance of LZ type data compression systems. The embodiments of the present invention utilize significantly fewer coincidence elements than the embodiments of said Ser. No. 10/195,795.

The present invention is embodied in a data compressor for compressing an input stream of data characters into an output stream of compressed codes. The compressor includes a plurality of coincidence elements corresponding to a respective plurality of codes to be assigned to strings. A string is comprised of a prefix string of at least one of the data characters followed by an extension character, a prefix string having a prefix code associated therewith. A coincidence element provides a coincidence output and has a prefix code input and a character input for enabling the coincidence element to energize the coincidence output thereof upon coincidental energization of the inputs so that energization of a coincidence output of a coincidence element provides a representation of the code corresponding thereto. The compressor further includes a first coupling arrangement for selectively coupling the provided representations of codes corresponding to the coincidence elements to the prefix code inputs of the coincidence elements and a second coupling arrangement for selectively coupling representations of data characters fetched from the input stream to the character inputs of the coincidence elements. Data characters are sequentially fetched from the input stream so as to sequentially enable coincidence elements until a last data character is fetched that does not result in an enabled coincidence element. The code is output that corresponds to the last enabled coincidence element, thereby providing the stream of compressed codes.

In the preferred embodiments, an extended string comprising the prefix string having the code corresponding to the last enabled coincidence element and the extension character corresponding to the last fetched data character is inserted into the compressor and assigned the next available code. The extended string is stored and the code assigned by coupling the representation of the code corresponding to the last enabled coincidence element and the representation of the last fetched data character to the prefix code input and the character input, respectively, of the coincidence element corresponding to the next code to be assigned to a string.

In the preferred embodiments, a representation of the last fetched data character is applied to the first coupling arrangement to begin a next compression cycle.

BRIEF DESCRIPTION OF THE DRAWINGS

FIG. 5 is a chart exemplifying the operations of the compressor of FIG. 1 in accordance with the control flow chart of FIG. 4.

DESCRIPTION OF THE PREFERRED EMBODIMENTS

The best mode embodiments described below, utilizing the switched input coincidence element implementation architecture of the present invention, are predicated, generally, on the LZW methodology. The embodiments are implemented in a manner similar to that described above where the single character strings are considered as recognized by the compressor although not explicitly included therein.

Figure 1:
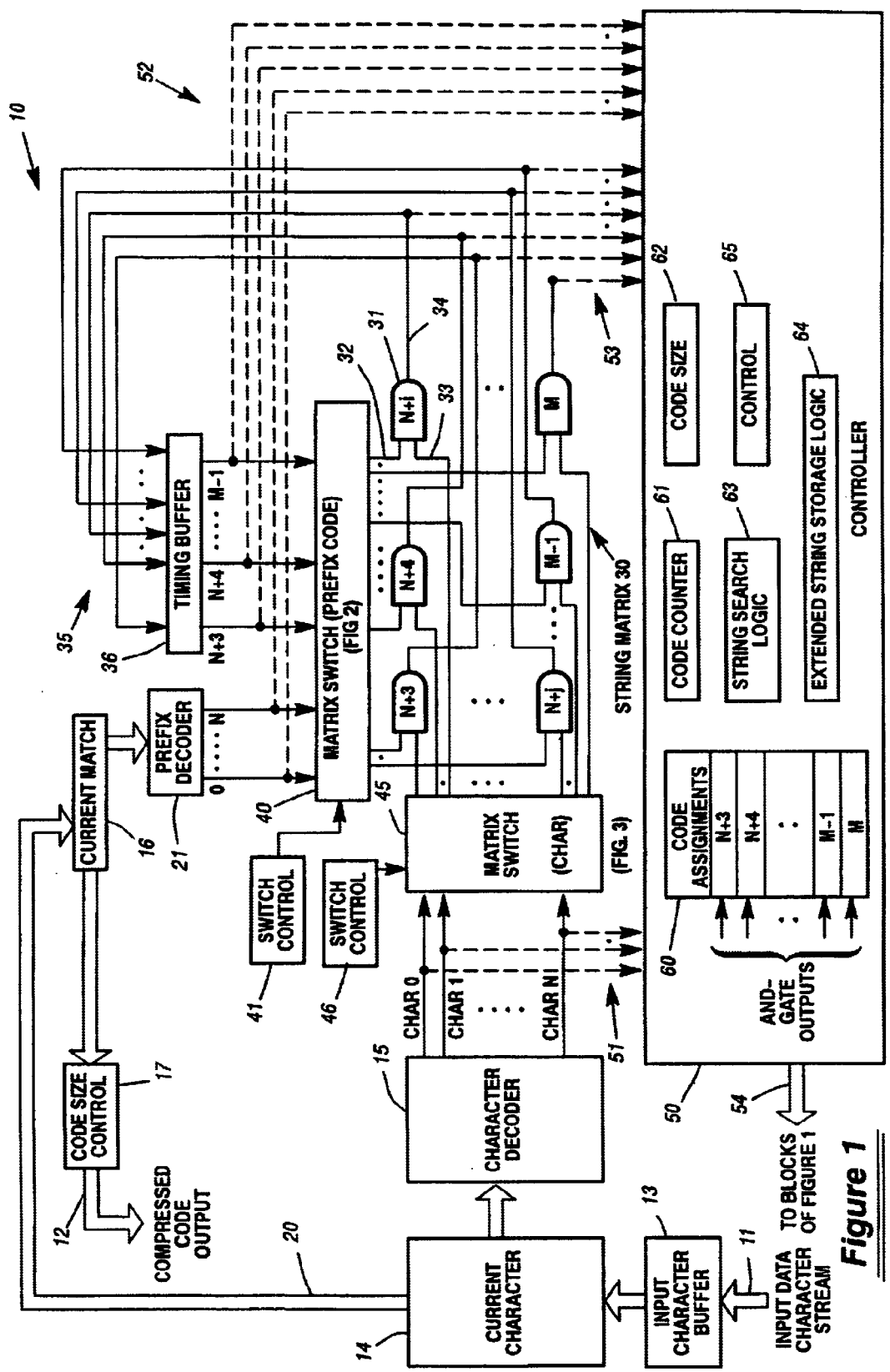
FIG. 1 is a schematic block diagram of a data compressor for compressing data in accordance with the present invention.

Referring to FIG. 1, a data compressor 10 is illustrated that compresses a stream of input data characters applied at an input 11 into a stream of corresponding compressed codes at an output 12. The input data character stream is buffered in an input character buffer 13. A current character register 14 is included for sequentially fetching the data characters from the buffer 13. The output of the current character register 14 is applied to a character decoder 15 that energizes a unique output thereof in accordance with the character held in the current character register. The energized output of the character decoder 15 thus provides a representation of the character held in the current character register. When the alphabet over which compression is being performed comprises character values 0-N, the outputs of the character decoder 15 are accordingly denoted as char 0—char N, respectively.

A string of data characters is comprised of a prefix string of one or more characters followed by an extension character, where the prefix string has a prefix code associated therewith. Single character prefix strings conveniently utilize the character values as the prefix codes. In a manner to be described, a string is represented in the compressor 10 and has a string code assigned thereto. A string code of N+3 is the first available string code assigned by the compressor 10 and a string code of M is the maximum assignable string code. The codes N+1 and N+2 may be utilized as control codes as is well known.

Typically, LZW data compressors are limited to 4096 string codes. When this limitation is applied to the present embodiments and when in the ASCII environment, the alphabet has an 8 bit character size supporting an alphabet of 256 characters having character values of 0–255. The first available multiple character string code may be 258 with the codes 256 and 257 utilized as control codes. In this example, the maximum assignable string code M is 4095.

The compressor 10 further includes a current match register 16 for conveniently holding the prefix code of a string under test. At the end of a compression cycle, the current match register 16 contains the code of a longest matched string which is provided from the current match register to the output 12 through a code size control circuit 17. The code size control circuit 17 is utilized, as is well known, to control the number of bits utilized for transmitting the compressed code from the output 12. In a variable length code implementation, the code size may begin with 9 bits and sequentially increase to 10, 11 and 12 bits at codes 512, 1024 and 2048, respectively. It is appreciated that a fixed code size may also be utilized to implement the embodiments.

To begin an initial compression cycle, the first character in the input data character stream is transferred through the current character register 14 to the current match register 16 via a bus 20. To begin a subsequent compression cycle, the current match register 16 is set to the mismatching character from the current character register 14 determined from the preceding compression cycle. During the compression cycles, prefix codes of strings under test are conveniently held in the current match register 16 in a manner to be described.

The output of the current match register 16 is applied to a prefix decoder 21 to provide prefix code representations for the single character prefix strings and the decoder outputs are, accordingly, denoted as prefix codes 0 through N. One of the prefix decoder outputs 0 through N is uniquely energized for a single character prefix value held in the current match register 16. The uniquely energized output of the prefix decoder 21 thus provides a representation of a single character prefix code residing in the current match register 16.

In the operation of the compressor 10, it is appreciated that the prefix decoder 21 is designed so that it only responds to the single character code values in the current match register 16 to provide the corresponding prefix decoder outputs 0 through N. When multiple character string codes N+3 and greater are entered into the current match register 16, the prefix decoder 21 does not provide an output.

The compressor 10 further includes a string matrix 30 comprised of a plurality of coincidence elements such as coincidence element 31. In the preferred embodiments of the invention, the coincidence elements 31 are implemented by AND-gates. The AND-gates of the string matrix 30 correspond, respectively, to the assignable string codes N+3 through M as indicated by the legends. In a manner to be described, an extended string encountered in the input is recorded by an AND-gate and assigned the string code corresponding thereto.

Each AND-gate, such as AND-gate 31, has an input 32 adapted to receive a prefix code representation and an input 33 adapted to receive a character representation. Each AND-gate, such as AND-gate 31, provides a coincidence output 34 that is energized upon coincidental energization of the inputs 32 and 33. Energization of the coincidence output 34 provides a representation of the code corresponding to the AND-gate.

An extended string recorded by an AND-gate has a prefix string with prefix code corresponding to the prefix code representation applied to the input 32 and an extension character corresponding to the character representation applied to the input 33. The code corresponding to the AND-gate is thus assigned to the string recorded thereby. A representation of the string code assigned to the string is provided by energization of the coincidence output 34 of the AND-gate. It is appreciated that the string code of a particular string becomes the code of the prefix of an extended string having the particular string as its prefix.

Thus, the coincidence outputs of the AND-gates N+3 through M−1, conveying the prefix code representations, are applied through respective leads 35 to the respective inputs of a timing buffer 36. The outputs of the timing buffer 36 are therefore denoted as N+3 through M−1. The timing buffer 36 provides a delay, either clocked or predetermined, between the inputs of the timing buffer and the corresponding outputs thereof so that an energized AND-gate coincidence output is applied to an AND-gate prefix code input in coincidence with the fetching of a next data character into the current character register 14.

Thus, the outputs of the prefix decoder 21 and the outputs of the timing buffer 36 are denoted as prefix codes 0 through M−1 with intermediate values N, N+3 and N+4, as illustrated. The codes N+1 and N+2 may be utilized as control codes and are therefore not illustrated as prefix code outputs using the above example of the ASCII environment with a maximum of 4096 codes, N will be 255, M will be 4095 with a maximum prefix code M−1 of 4094. The first available code N+3 for assignment to a multiple character string will be 258 and the control codes may be 256 and 257.

The compressor 10 further includes a matrix switch 40 with a plurality of inputs and a plurality of outputs. The plurality of inputs of the matrix switch 40 are coupled to the respective prefix code outputs 0 through M−1 of the prefix decoder 21 and the timing buffer 36. The plurality of outputs of the matrix switch 40 are coupled to the respective prefix code inputs of the AND-gates N+3 through M of the string matrix 30. A switch control 41, coupled to the matrix switch 40, controls the matrix switch to selectively couple any one of the matrix switch inputs to one or more of the matrix switch outputs. In this manner, the prefix code outputs of the prefix decoder 21 and the timing buffer 36 are selectively coupled to the prefix code inputs of the AND-gates of the string matrix 30. It is appreciated that a particular matrix switch input can be coupled to the prefix code inputs of more than one of the AND-gates. Further details of the matrix switch 40 will be described with respect to FIG. 2.

The compressor 10 further includes a matrix switch 45 with a plurality of inputs and a plurality of outputs. The plurality of inputs of the matrix switch 45 are coupled to respective outputs of the character decoder 15. The plurality of outputs of the matrix switch 45 are coupled to respective character inputs of the AND-gates of the string matrix 30. A switch control 46, coupled to the matrix switch 45, controls the matrix switch to selectively couple any one of the matrix switch inputs to one or more of the matrix switch outputs. In this manner, the char 0 through char N outputs of the character decoder 15 are selectively coupled to the character inputs of the AND-gates of the string matrix 30. It is appreciated that a particular output of the character decoder 15 can be coupled to the character inputs of more than one AND-gate. Further details of the matrix switch 45 will be described with respect to FIG. 3.

The compressor 10 includes a controller 50 responsive to control inputs represented as dashed lines. The controller 50 receives control inputs 51 from the char 0 through char N outputs of the character decoder 15, control inputs 52 from the prefix code outputs 0 through M−1 of the prefix decoder 21 and timing buffer 36 and control inputs 53 from the coincidence outputs of the AND-gates N+3 through M. The controller 50 provides control signals to the blocks of FIG. 1 via a bus 54, to control the operations of the compressor 10 in a manner to be described.

The controller 50 includes a code assignment table 60 for storing the respective string codes assigned to the AND-gates of the string matrix 30. As illustrated, the code assignment table 60 is storing the codes N+3 through M corresponding to the similarly denoted AND-gates. The coincidence outputs of the AND-gates are coupled via the leads 53 to access the respective locations of the code assignment table 60. When a coincidence output of an AND-gate is energized, the corresponding code from the code assignment table 60 is transferred by the controller 50 via the bus 54 to the current match register 16. Conveniently, in the search for a longest matching string, codes accessed in the code assignment table 60 are sequentially entered into the current match register 16 so that when a character is fetched to the current character register 14 that results in no energized AND-gate coincidence output, the current match register 16 will be holding the code of the longest matching string. Alternatively, a longest match buffer can be included in the controller 50 for sequentially receiving the accessed codes from the code assignment table 60 and providing the code of the longest match to the code size control 17.

It is appreciated that the code assignment table 60 may be initialized with all of the assignable string codes N+3 through M. Alternatively, the string codes may be stored in the locations of the table when required to be assigned to a string to be recorded at an AND-gate. It is further appreciated that when the string codes of the code assignment table, which are multiple character string codes, are entered into the current match register 16, the controller 50 disables the prefix decoder 21 from providing an output. Alternatively, the prefix decoder 21 may be designed so that it only responds to the single character code values in the current match register 16 to provide the corresponding prefix decoder outputs 0 through N.

The controller 50 includes a code counter 61 for registering the next code to be assigned to a string. The code counter 61 indicates the code corresponding to the next available AND-gate for recording an extended string to be stored. The code counter 61 is initialized to the first available code N+3 and is incremented for each recorded string until the maximum assignable code M is exceeded. Any convenient mechanism such as counter overflow can be utilized to detect that the code counter 61 has exceeded the maximum assignable code. When this occurs the compressor 10 continues to compress input data without recording additional strings until the compressor 10 is reinitialized. At reinitialization, the code counter 61 is reset to the first available string code.

The controller 50 further includes a code size register 62 for determining the code size utilized by the code size control 17 for transmitting the compressed codes on the output 12. The code size in the code size register 62 is set in accordance with the count in the code counter 61. The code size is set to an initial value and incremented at predetermined codes of the code counter 61 until a maximum code size is attained. In the ASCII example discussed above, the code size may begin with 9 bits and sequentially increase to 10, 11 and 12 bits at codes 512, 1024 and 2048, respectively.

The controller 50 further includes string search logic 63 and extended string storage logic 64. The logic 63 determines the longest match of the input data character stream 11 with an extended string recorded by an AND-gate of the string matrix 30. The logic 64 records an extended string encountered in the input at a next available AND-gate of the string matrix 30. The controller 50 also includes control circuit 65 for controlling the detailed operations to be executed by the compressor 10 in accordance with the flow chart diagram of FIG. 4 to be described. The control circuit 65 is considered as containing appropriate circuitry, such as state machines, or appropriate software to control execution of the operations.

Figure 2:
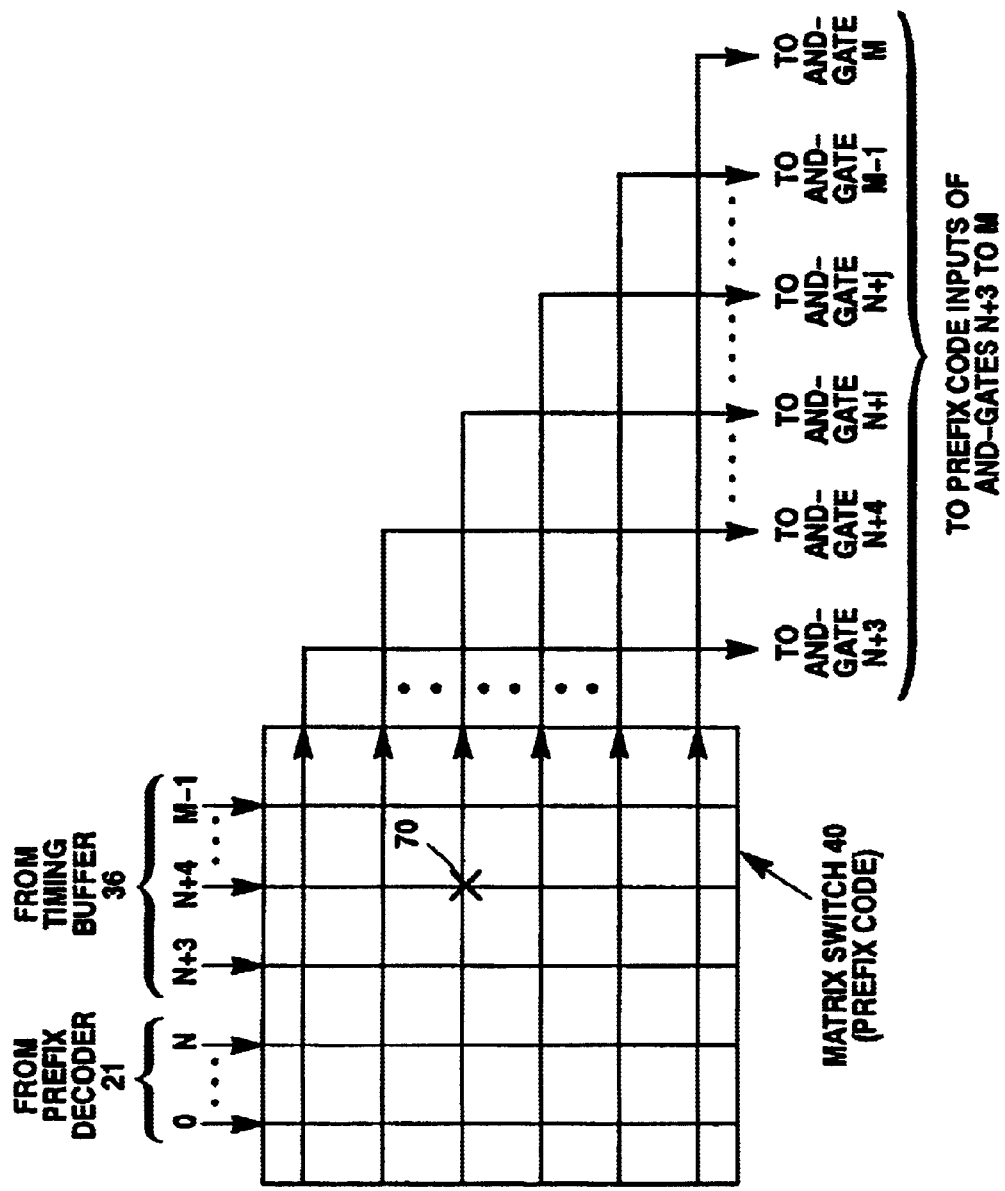
FIG. 2 is a schematic block diagram illustrating details of the character matrix switch component of FIG. 1.

Referring to FIG. 2, where like reference numerals indicate like components with respect to FIG. 1 and with continued reference to FIG. 1, further details of the matrix switch 40 are illustrated. The matrix switch 40 is comprised of columns coupled to the matrix switch inputs and rows coupled to the matrix switch outputs. The columns of the matrix switch receive inputs from the prefix code representation outputs of the prefix decoder 21 and the timing buffer 36 and the matrix switch rows provide outputs to the prefix code inputs of the AND-gates N+3 to M. Each column and row intersection is a controllable switch connection, such as switch connection 70, actuated by the switch control 41. The switch control 41 is operative for selectively coupling any one of the matrix switch 40 inputs to one or more of the matrix switch outputs. For example, the switch connection 70 connects the N+4 output from the timing buffer 36 to the prefix code input of the AND-gate N+i.

Figure 3:
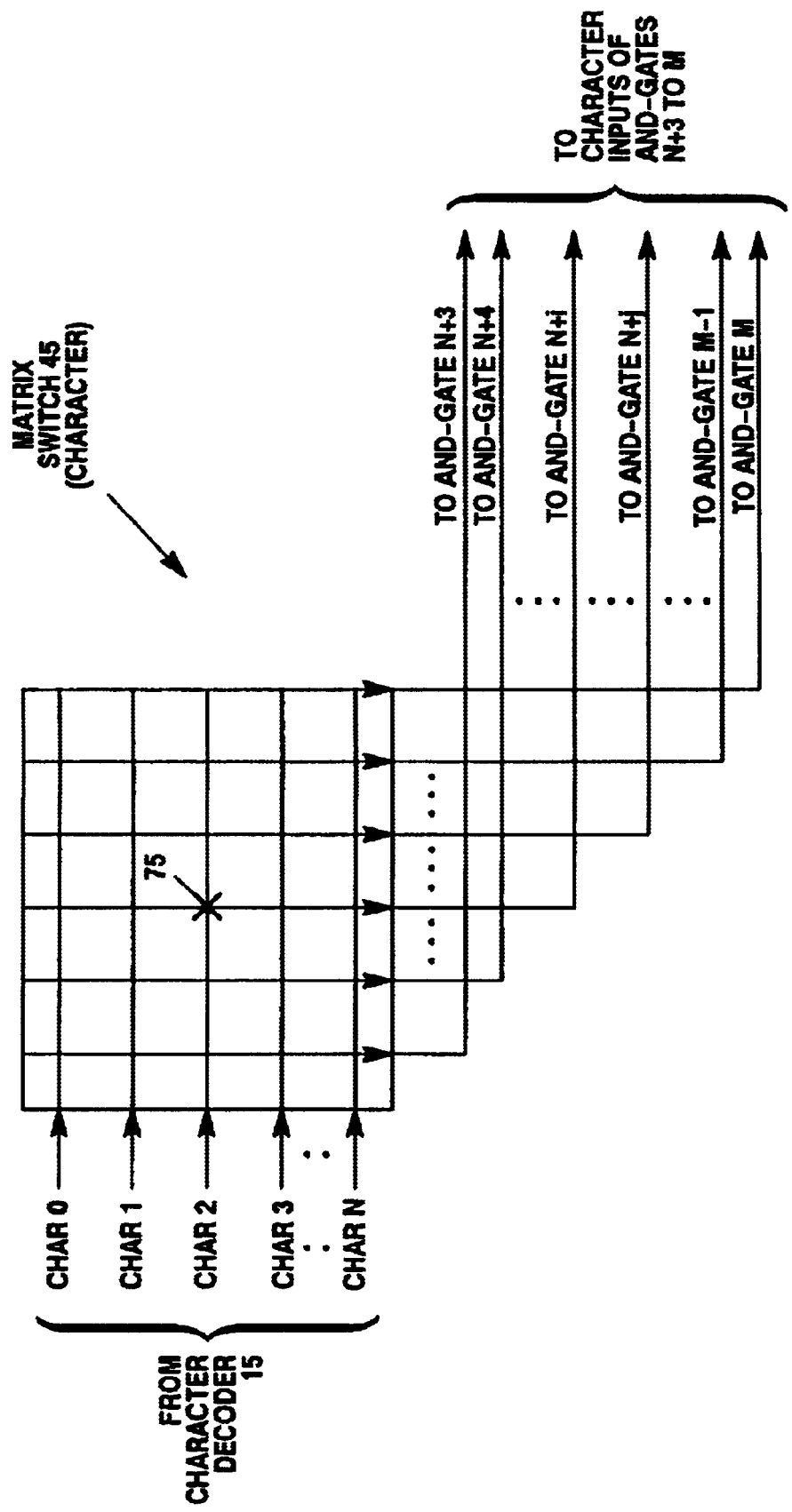
FIG. 3 is a schematic block diagram illustrating details of the prefix code matrix switch component of FIG. 1.

Referring to FIG. 3, where like reference numerals indicate like components with respect to FIG. 1 and with continued reference to FIG. 1, further details of the matrix switch 45 are illustrated. The matrix switch 45 is comprised of rows coupled to the matrix switch inputs and columns coupled to the matrix switch outputs. The matrix switch rows receive inputs from the character representation outputs of the character decoder 15 and the matrix switch columns provide outputs to the character inputs of the AND-gates N+3 to M. Each row and column intersection is a controllable switch connection, such as the switch connection 75, actuated by the switch control 46. The switch control 46 is operative for selectively coupling any one of the matrix switch inputs to one or more of the matrix switch outputs. For example, the char 2 output from the character decoder 15 is coupled through the switch connection 75 to the character input of AND-gate N+i.

With continued reference to FIGS. 1–3, it is appreciated that with the switch connections 70 and 75 illustrated in FIGS. 2 and 3, the AND-gate N+i is recording the extended string having a prefix string with code N+4 and an extension character of char 2.

Briefly, the operation of the compressor 10 is as follows. The compressor 10 operates in compression cycles wherein strings of data characters fetched from the input data character stream are compared to strings previously encountered by the compressor 10, and recorded by the AND-gates of the string matrix 30, to determine the longest match therewith. A string is recorded by an AND-gate by establishing a connection through the matrix switch 40 from a prefix code output of the prefix decoder 21 or timing buffer 36 to the prefix code input of the AND-gate and establishing a connection in the matrix switch 45 from a character output of the character decoder 15 to the character input of the AND-gate. In the first compression cycle, the first input data character is set into the current match register 16 and the next input data character is fetched into the current character register 14. In subsequent compression cycles, the current match register is set to the mismatching character in the current character register 14 from the previous cycle and the next data character is fetched to the current character register 14. If an AND-gate has previously recorded the two character string represented by current match and current character, the energized coincidence output of the AND-gate accesses the code assignment table 60 so that the code corresponding to the AND-gate is transferred to the current match register 16. The energized coincidence output of the AND-gate is also applied, via the leads 35, to the timing buffer 36 so that the appropriate prefix code representation is applied to the matrix switch 40 in coincidence with fetching the next input data character to the current character register 14. The procedure is repeated with the controller 50 detecting the sequentially enabled AND-gates until a character fetched into the current character register 14 results in no enabled AND-gate. When this occurs, the character in the current character register 14 is the mismatching character and the code of the longest matching string resides in the current match register 16. The code of the longest matching string in the current match register 16 is provided at the output 12 in the number of bits determined by the code size control 17.

An appropriate update extended string is entered into the compressor 10 by recording the string in the next available AND-gate corresponding to the next available code to be assigned. Accordingly, an appropriate switch connection is established in the matrix switch 40 that couples the energized prefix code output from the prefix decoder 21 or timing buffer 36 to the prefix code input of this next available AND-gate and an appropriate switch connection is established in the matrix switch 45 that couples the energized character output of the character decoder 15 to the character input of this next available AND-gate. To begin the next compression cycle, the character in the current character register 14 is transferred to the current match register 16 and the next input data character is fetched to the current character register 14.

Figure 4:
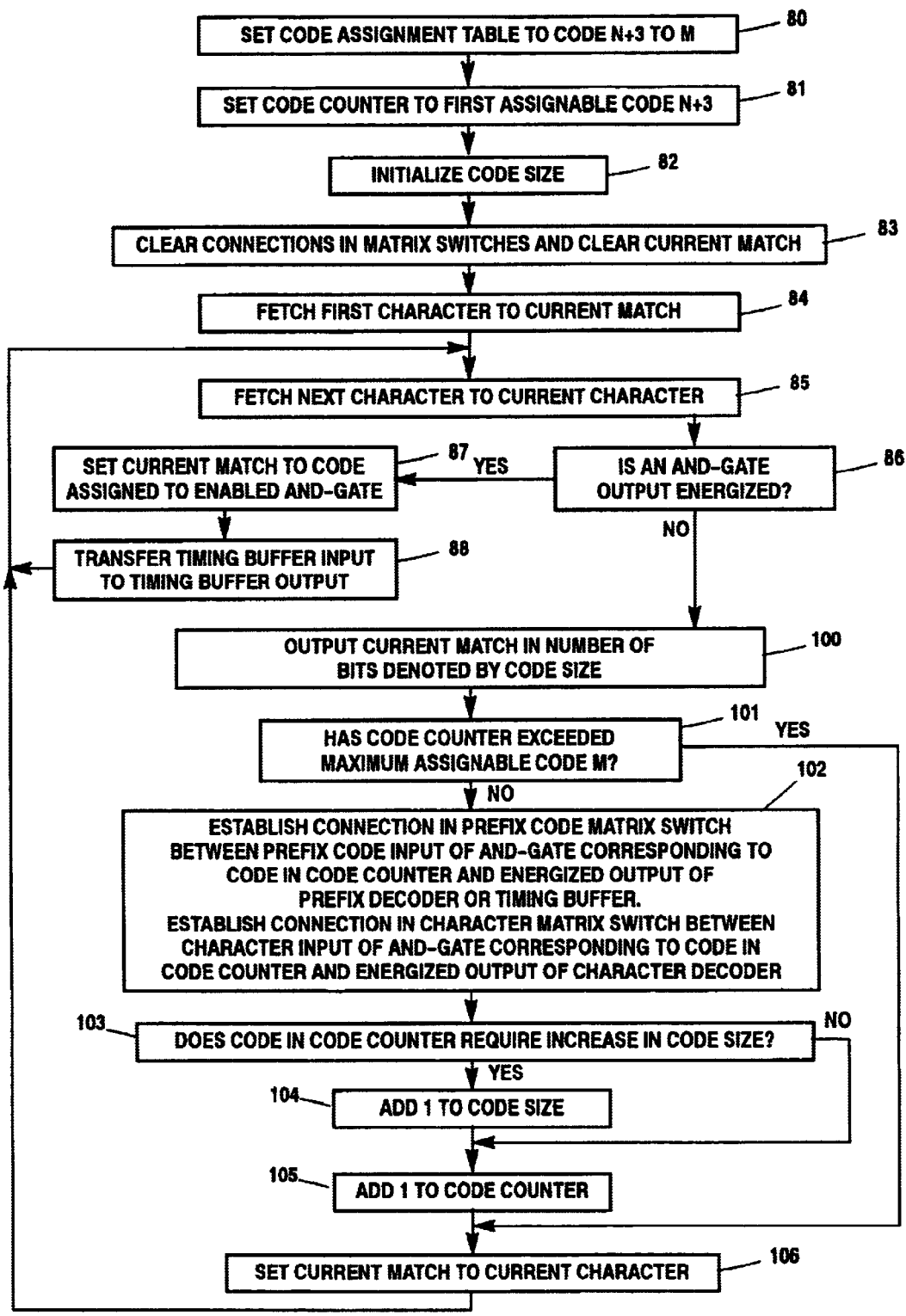
FIG. 4 is a control flow chart illustrating the operations executed by the compressor of FIG. 1 so as to perform data compression in accordance with the present invention.

Referring to FIG. 4, with continued reference to FIGS. 1–3, a control flow chart is illustrated showing the detailed flow of operations to be executed by the compressor 10. The controller 50 is considered as containing appropriate circuitry, such as state machines, to control execution of the operations.

At a block 80, the locations of the code assignment table 60 are set to respective codes N+3 to M and at a block 81, the code counter 61 is set to the first assignable code N+3. Since the codes N+3 to M are sequentially assigned to strings encountered in the input, all of the codes may initially be set into the respective locations of the code assignment table 60. Alternatively, the codes may be sequentially set into the table locations from the code counter 61 when required.

At a block 82, the code size register 62 is initialized to the beginning code size, for example, 9 bits in ASCII embodiments. At a block 83, all of the connections in the matrix switches 40 and 45 are opened and the current match register 16 is cleared. At a block 84, the first input data character is fetched to the current match register 16 and, at a block 85, the next input data character is fetched to the current character register 14.

At a block 86, the controller 50 tests the control inputs 53 to determine if an AND-gate output is energized. If yes, control proceeds to a block 87 at which the current match register 16 is set to the code corresponding to the enabled AND-gate detected at the block 86. The energized AND-gate output accesses the appropriate location of the code assignment table 60 and the code stored thereat is transferred by the controller 50 to the current match register 16. Processing proceeds from the block 87 to a block 88 whereat the input to the timing buffer 36 from the energized AND-gate output is transferred to the timing buffer output. Control then returns to the block 85 to continue searching the input data character stream for a longest matching string.

If, at the block 86, no AND-gate output is determined to be energized, control proceeds to a block 100 at which the code in the current match register 16 is provided at the output 12 utilizing the number of bits determined by the code size register 62 and the code size control 17.

Control proceeds from the block 100 to a block 101 whereat the controller 50 determines if all of the codes have been assigned to encountered strings. This may be done, for example, by determining if the code counter 61 has exceeded the maximum assignable code M.

If a next code is available to be assigned, control proceeds to a block 102 whereat the controller 50, via the switch control 41, establishes the connection in the matrix switch 40 between the prefix code input of the AND-gate corresponding to the code in the code counter 61 and the energized prefix code output of either the prefix decoder 21 or the timing buffer 36. The controller 50 also, via the switch control 46, establishes the connection in the matrix switch 45 between the character input of the AND-gate corresponding to the code in the code counter 61 and the energized output of the character decoder 15.

By this procedure the next available code is assigned to the string whose prefix is represented by the energized prefix code representation output of either the prefix decoder 21 or the timing buffer 36 and whose extension character is resident in the current character register 14. This string is thereby recorded in the AND-gate corresponding to the next available code.

Control proceeds from the block 102 to a block 103 whereat the code in the code counter 61 is tested to determine if an increase in code size is required. If so, control continues to a block 104 whereat the code size register 62 is incremented by 1. If an increase in code size is not required at the block 103, the block 104 is bypassed to continue the operations at a block 105. At the block 105, the code counter 61 is incremented by 1.

Control proceeds from the block 105 to a block 106 whereat the current match register 16 is set to the character in the current character register 14 via the bus 20. Control then returns to the block 85 to begin the next compression cycle.

If, at the block 101, all of the codes are assigned, control proceeds directly to the block 106 bypassing the operations of blocks 102–105.

It is appreciated from the foregoing that the loop comprising the blocks 85–88 sequentially fetches the input data characters into the current character register 14 thereby sequentially enabling AND-gates until an input data character is fetched that results in no AND-gate coincidence output energization. When this occurs, the longest matching string has been determined with the code thereof residing in the current match register 16. The extended string comprising the longest match extended by the mismatching character residing in the current character register 14, which is the next data character in the input following the longest match, is readily set into the compressor 10 by, at the block 102, establishing the described matrix switch connections to the inputs of the AND-gate recording the extended string.

Referring to FIG. 5, with continued reference to FIGS. 1–4, an example of the operation of the compressor 10 in accordance with the flow chart of FIG. 4 is illustrated. At the top of FIG. 5, an input data character stream is shown where sequential characters are identified by character sequence numbers. This is done to facilitate following the progress of the characters through the steps of the example. It is appreciated that the sequence numbers are shown for purposes of character identification and do not appear in the actual data character stream.

The example is largely self-explanatory, with the actions performed delineated in the left-hand column and the blocks of FIG. 4 that participate in the actions designated in the right-hand column. For simplification of description and presentation of FIG. 5, the energized prefix code output of the prefix decoder 21 or the timing buffer 36 is considered as "current match" and the energized output of the character decoder 15 is considered as "current character".

An AND-gate enabled in an action is identified by the code corresponding thereto. If, as the result of applying current match and current character to the string matrix 30, an AND-gate is enabled, the code assigned thereto is denoted in the designated column. The legend "NONE" is utilized to indicate that no AND-gate is enabled. This occurs when both current match and current character are not yet coupled through the matrix switches to the respective inputs of an AND-gate. The AND-gate and code assignment as discussed above with respect to FIG. 4, block 102, is indicated in the assigned AND-gate column. For the purposes of the illustrated example, the available codes to be assigned begin with code 258.

The operational example of FIG. 5 graphically demonstrates the novel data compression implementation architecture of the present invention for recording data character strings in the compressor 10, searching the input stream for the longest match with the recorded strings and updating the recorded strings with an extended string. For example, action 1 illustrates how the string "ab" is recorded in the compressor 10. The single character string "a" is fetched to current match at the block 84 of FIG. 4 and the next character "b" is fetched to current character at block 85. Since the string "ab" has not been encountered before, no AND-gate is enabled at the block 86. Accordingly, at the block 100 of FIG. 4, the longest matching string "a" is output and at the block 102, the energized current match and current character representations are coupled through the matrix switches to the inputs of the AND-gate corresponding to code 258, which code is now assigned to the string "ab".

In action 3, the string "ab" is again encountered and consequently the AND-gate corresponding to code 258 is enabled as detected at block 86 of FIG. 4. In action 4, the code 258 is set into the current match register at the block 87, the prefix code representation of code 258 is transferred from the timing buffer input to the output thereof at the block 88 and the next input character "a" is fetched to current character at the block 85. In action 4, since both the prefix code and character representations of "258a" are not coupled to respective inputs of an AND-gate, as detected at block 86, the string "aba" is recorded in the compressor 10 at block 102 of FIG. 4 by connecting the energized current match and current character representations to the respective inputs of the AND-gate corresponding to the code 260.

In the embodiments described herein, when the last input data character has been fetched, the value in the current match register 16 is output as the last compressed code. Thus, in action 19, the last character of the exemplified input data character stream is output as illustrated.

More detailed descriptions of the actions of FIG. 5 relative to the blocks of FIG. 4 are readily apparent and will not be provided for brevity.

Figure 6:
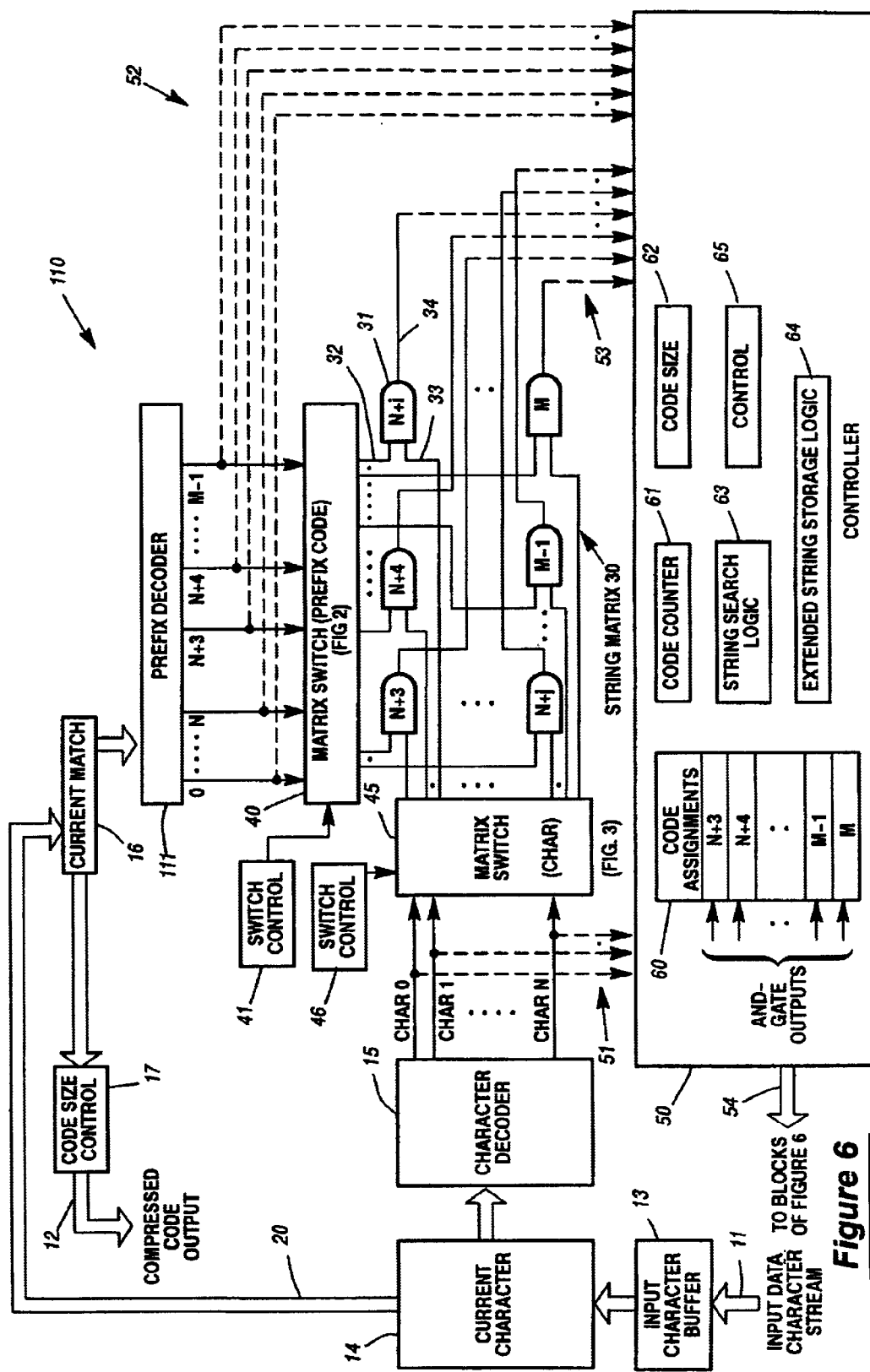
FIG. 6 is a schematic block diagram of an alternative embodiment of a data compressor for compressing data in accordance with the present invention.

Referring to FIG. 6, where like reference numerals indicate like components with respect to FIG. 1 and with continued reference to FIGS. 1–4, an alternative embodiment of the present invention of a data compressor 110 is illustrated. The embodiment of FIG. 6 is substantially similar to the embodiment of FIG. 1 and therefore operates in a manner similar to that described above with respect to FIG. 1 generally following the flow of operations depicted in FIG. 4. The operational example of FIG. 5 is also applicable to the FIG. 6 embodiment. The descriptions given above with respect to the components of FIG. 1 also apply to the similarly numbered components of FIG. 6.

The principal difference between the embodiments of FIGS. 1 and 6 is the manner in which the prefix code representations are fed back from the AND-gate outputs to the matrix switch 40. In FIG. 1, the energized AND-gate outputs are fed directly back through the leads 35 and the timing buffer 36. In the FIG. 6 embodiment, the prefix decoder 21 and timing buffer 36, as well as the leads 35, are replaced by a prefix decoder 111. The output of the current match register 16 is applied to the prefix decoder 111 which energizes a unique output thereof in accordance with the value of the prefix code held in the current match register. The uniquely energized output of the prefix decoder 111 thus provides a representation of the prefix code residing in the current match register 16. Prefix codes corresponding to energized AND-gate outputs are provided to the current match register 16 from the code assignment table 60 in the operations of the FIG. 6 embodiment in the manner described above.

The outputs of the prefix decoder 111 are denoted as prefix codes 0 through M−1 with intermediate values N, N+3 and N+4, as illustrated. The codes N+1 and N+2 may be utilized as control codes and are therefore not illustrated as outputs of the decoder 111. It is appreciated that one of the prefix decoder outputs 0 through N will be energized for a single character prefix value held in the current match register 16 and that one of the outputs N+3 through M−1 will be energized when the code of a multiple character prefix resides in the current match register 16. It is furthermore appreciated that when one of the prefix decoder outputs 0-N is energized, the string under test is a two-character string.

The controller 50 includes control 112 for controlling the operations in a manner similar to that described above with respect to FIG. 1. The control 112 additionally includes circuitry for controlling the operations specific to the described prefix decoder 111 arrangement of FIG. 6.

Figure 7:
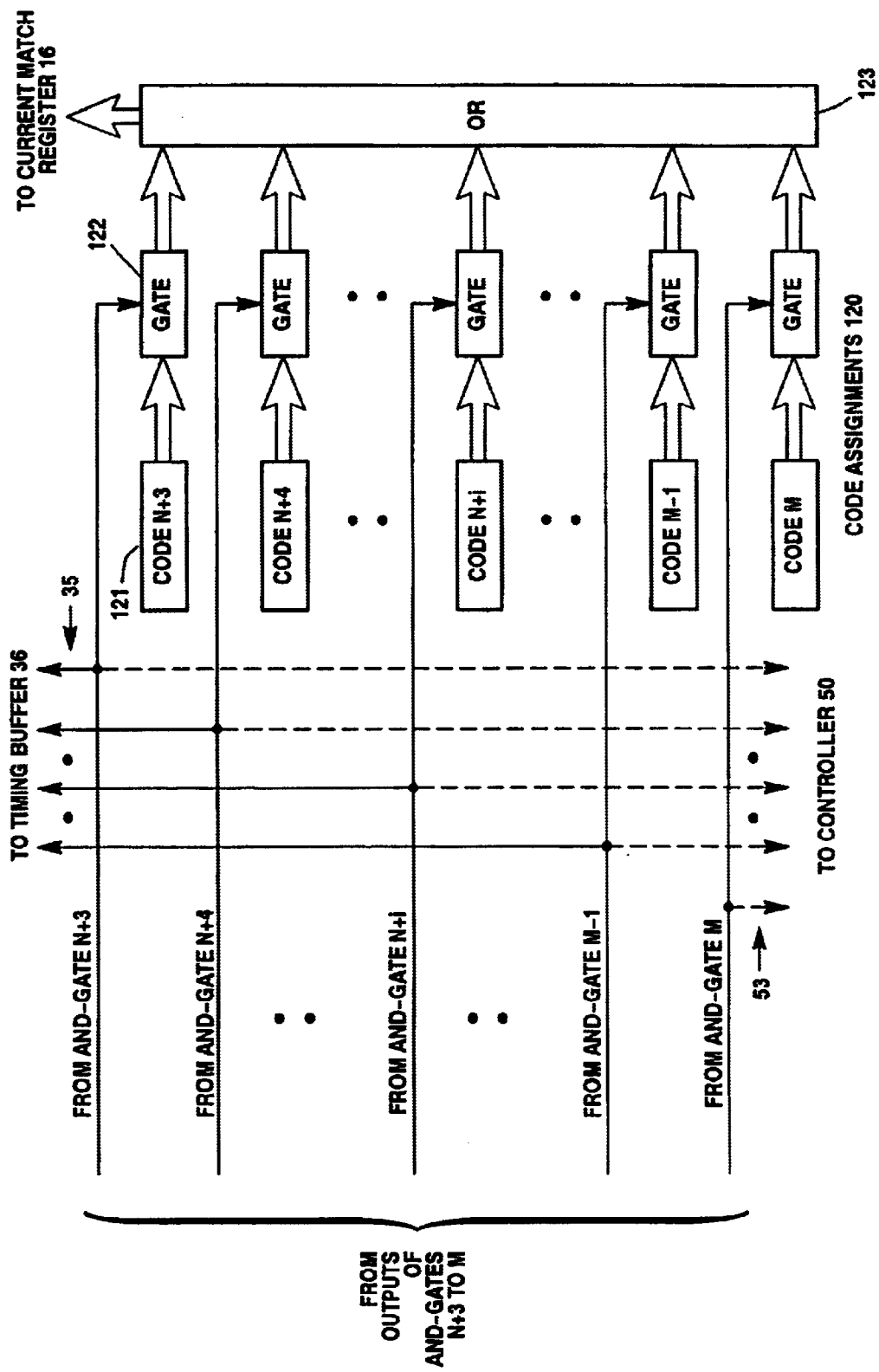
FIG. 7 is a schematic block diagram of modifications for the FIG. 1 and FIG. 6 embodiments of the present invention.

Referring to FIG. 7, with continued reference to FIGS. 1 and 6, a modification to the embodiments of FIGS. 1 and 6 is illustrated. A plurality of code assignment elements 120 replace the code assignment table 60 for providing the prefix codes to the current match register 16. Accordingly, each code assignment element is comprised of a string code register and a gate, such as the register 121 and the gate 122. The registers are illustrated as holding the respective codes N+3 through M. When the coincidence output of an AND-gate is energized, the code in the corresponding register is transmitted through the enabled gate to an OR-gate 123. The OR-gate provides the binary representation of the code from the corresponding code assignment register to the current match register 16. It is understood that in the FIG. 6 embodiment the leads 35 and the timing buffer 36 are not utilized.

Although the above embodiments of the present invention are explained in terms of the matrix switches 40 and 45, other coupling arrangements may alternatively be utilized to effect the above described connections.

It is appreciated that the embodiments of the present invention do not utilize a dictionary or string table for storing and searching previously encountered strings thereby eliminating the disadvantages, such as hash or sibling list searching, that are attendant prior art designs.

It is appreciated that the operations of the above described data compression embodiments generally follow the LZW protocols. The compressors provide an LZW compressed code output wherefrom the corresponding data character stream is recoverable by a standard LZW decompressor configuration.

The embodiments of the present invention are substantially universal with respect to alphabet size. With N as the largest character value in an N+1 character alphabet, smaller alphabets are accommodated by adjusting the codes stored in the code assignment table 60. For example, if N is 255 in an ASCII alphabet, the first assignable code N+3 may be 258. If N is 3 in a 4 character alphabet, the first assignable code N+3 may be 6. Of course a sufficient number of AND-gates should be included in the design to accommodate the assignable codes.

Although the above disclosed embodiments of the present invention are described in terms of the LZW data compression protocols, it is appreciated that the architecture of the present invention can be readily utilized with other data compression protocols such as, for example, LZ2.

While the invention has been described in its preferred embodiments, it is to be understood that the words which have been used are words of description rather than of limitation and that changes may be made within the purview of the appended claims without departing from the true scope of the invention in its broader aspects.

What is claimed is:

1. Data compression apparatus for compressing an input stream of data characters into an output stream of compressed codes, comprising
   a plurality of coincidence elements corresponding to a respective plurality of codes to be assigned to strings, a string being comprised of a prefix string of at least one of said data characters followed by an extension character, a prefix string having a prefix code associated therewith, a coincidence element providing a coincidence output and having a prefix code input and a character input for enabling the coincidence element to energize the coincidence output thereof upon coincidental energization of the inputs thereof so that energization of a coincidence output of a coincidence element provides a representation of the code corresponding thereto, first coupling means for selectively coupling the representations of codes corresponding to the coincidence elements to the prefix code inputs of the coincidence elements, second coupling means for selectively coupling representations of data characters fetched from said input stream to the character inputs of the coincidence elements, means for sequentially fetching data characters from said input stream so as to sequentially enable coincidence elements until a last data character is fetched that does not result in an enabled coincidence element, and means for outputting the code corresponding to the last enabled coincidence element, thereby providing said stream of compressed codes.

2. The apparatus of claim 1 wherein said first coupling means comprises means for coupling the representation of the code corresponding to said last enabled coincidence element to the prefix code input of the coincidence element corresponding to the next code to be assigned to a string, and said second coupling means comprises means for coupling the representation of said last data character to the character input of said coincidence element corresponding to said next code to be assigned, thereby assigning said next code to the string comprising the prefix string having the code corresponding to said last enabled coincidence element and the extension character corresponding to said last data character.

3. The apparatus of claim 1 wherein said plurality of coincidence elements comprises a plurality of AND-gates.

4. The apparatus of claim 1 wherein said first coupling means comprises prefix code switch means.

5. The apparatus of claim 1 wherein said second coupling means comprises character switch means.

6. The apparatus of claim 4 wherein said prefix code switch means comprises a matrix switch.

7. The apparatus of claim 5 wherein said character switch means comprises a matrix switch.

8. The apparatus of claim 4 wherein said apparatus operates in compression cycles, further including means for applying a representation of said last data character to said prefix code switch means to begin a next compression cycle.

9. The apparatus of claim 4 wherein said first coupling means comprises means for directly coupling said representations of codes to said prefix code switch means.

10. The apparatus of claim 9 wherein said first coupling means further includes a code decoder responsive to character values for providing a plurality of outputs corresponding to respective characters, a unique decoder output being energized in accordance with the character value applied thereto, said outputs of said code decoder providing representations of codes corresponding to said character values to said prefix code switch means.

11. The apparatus of claim 1 further including code assignment means for providing the codes corresponding to said coincidence elements in response to the energized coincidence outputs thereof, said means for outputting comprising means for outputting the code provided by said code assignment means that corresponds to the last enabled coincidence element, thereby providing said stream of compressed codes.

12. The apparatus of claim 4 wherein said first coupling means comprises code assignment means for providing the codes corresponding to said coincidence elements in response to the energized coincidence outputs thereof, a code register for holding the codes, and a code decoder coupled to said code register for providing a plurality of outputs corresponding to respective codes, a unique decoder output being energized in accordance with the code held in said code register, said outputs of said code decoder providing said representations of codes to said prefix switch means.

13. The apparatus of claim 5 wherein said data characters are from an alphabet of data characters and wherein said second coupling means comprises a character register for holding a data character, and a character decoder coupled to said character register for providing a plurality of outputs corresponding to the respective characters of said alphabet, a unique decoder output being energized in accordance with the character held in said character register, said outputs of said character decoder providing said representations of data characters to said character switch means.

14. The apparatus of claim 11 wherein said code assignment means includes a code register for holding one of said codes, and a transmission gate coupled to said code register and enabled by a coincidence output for transmitting the code in said code register upon energization of said coincidence output.

15. The apparatus of claim 12 wherein said code assignment means includes a further code register for holding one of said codes, and a transmission gate coupled to said further code register and enabled by a coincidence output for transmitting the code in said further code register upon energization of said coincidence output.

16. A data compression method for compressing an input stream of data characters into an output stream of compressed codes, comprising providing a plurality of coincidence elements corresponding to a respective plurality of codes to be assigned to strings, a string being comprised of a prefix string of at least one of said data characters followed by an extension character, a prefix string having a prefix code associated therewith, a coincidence element providing a coincidence output and having a prefix code input and a character input for enabling the coincidence element to energize the coincidence output thereof upon coincidental energization of the inputs thereof so that energization of a coincidence output of a coincidence element provides a representation of the code corresponding thereto, selectively coupling the representations of codes corresponding to the coincidence elements to the prefix code inputs of the coincidence elements, selectively coupling representations of data characters fetched from said input stream to the character inputs of the coincidence elements, sequentially fetching data characters from said input stream so as to sequentially enable coincidence elements until a last data character is fetched that does not result in an enabled coincidence element, and outputting the code corresponding to the last enabled coincidence element, thereby providing said stream of compressed codes.

17. The method of claim 16 further including coupling the representation of the code corresponding to said last enabled coincidence element to the prefix code input of the coincidence element corresponding to the next code to be assigned to a string, and coupling the representation of said last data character to the character input of said coincidence element corresponding to said next code to be assigned, thereby assigning said next code to the string comprising the prefix string having the code corresponding to said last enabled coincidence element and the extension character corresponding to said last data character.

18. The method of claim 17 wherein said method operates in compression cycles, further including utilizing a prefix code switch for selectively coupling the representations of codes to the prefix code inputs of the coincidence elements, and applying a representation of said last data character to said prefix code switch to begin a next compression cycle.

* * * * *